(12) United States Patent
Roithmeier

(10) Patent No.: US 8,773,211 B2
(45) Date of Patent: Jul. 8, 2014

(54) COMMON MODE REJECTION CIRCUIT

(75) Inventor: Andreas Roithmeier, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 69 days.

(21) Appl. No.: 13/304,438

(22) Filed: Nov. 25, 2011

(65) Prior Publication Data

US 2013/0135057 A1 May 30, 2013

(51) Int. Cl.
*H03B 5/12* (2006.01)

(52) U.S. Cl.
CPC ............ *H03B 5/1215* (2013.01); *H03B 5/1228* (2013.01); *H03B 5/1284* (2013.01); *H03B 2200/0054* (2013.01); *H03B 2201/035* (2013.01); *H03B 2202/05* (2013.01)
USPC ..................................... 331/117 FE; 331/175

(58) Field of Classification Search
CPC ........... H03H 11/24; H03B 2201/0208; H03B 2201/0216
USPC ............... 331/117 R, 117 FE, 36 R, 167, 175
See application file for complete search history.

(56) References Cited

U.S. PATENT DOCUMENTS

| 2006/0279368 | A1 | 12/2006 | Rohde et al. | |
|---|---|---|---|---|
| 2007/0085617 | A1* | 4/2007 | Salerno | 331/167 |
| 2008/0143446 | A1* | 6/2008 | Yao et al. | 331/45 |
| 2008/0266005 | A1* | 10/2008 | Jacobsson et al. | 331/108 A |
| 2010/0033257 | A1* | 2/2010 | Pellerano et al. | 331/1 A |
| 2011/0261871 | A1* | 10/2011 | Staszewski et al. | 375/224 |

FOREIGN PATENT DOCUMENTS

EP 0816857 A2 7/1998

OTHER PUBLICATIONS

Hegazi et al.,"The Designers Guide to High-Purity Oscillators", 2005, ISBN 978-1-4020-7666-5, pp. 94-95 & 126-127.*
http://www.rp-photonics.com/q_factor.html.
K. Hoshino, et al., "A 1.5V, 1.7mA 700 MHz CMOS LC Oscillator with No Upconverted Flicker Noise", Electrical Engineering Department, University of California.
Emad Hegazi, et al., "A Filtering Technique to Lower LC Oscillator Phase Noise", IEE Journal of Solid-State Circuits, vol. 36, No. 12, Dec. 2001, p. 1921-1930.
Aly Ismail, et al., "CMOS Differential LC Oscillator with Suppressed Up-Converted Flicker Noise", 2003 IEEE International Solid-State Circuits Conference.

* cited by examiner

*Primary Examiner* — Ryan Johnson
(74) *Attorney, Agent, or Firm* — Eschweiler & Associates, LLC

(57) ABSTRACT

An electrical circuit includes a circuit element and a common mode rejection circuit element. The circuit element is configured to operate at a selected frequency within a variable frequency range and the common mode rejection circuit element is configured to reject a common mode current through the circuit element, wherein the common mode rejection circuit element is adjustable.

16 Claims, 5 Drawing Sheets

COMMON MODE REJECTION CIRCUIT

FIELD

Embodiments of the invention refer to an electrical circuit comprising a common mode rejection circuit, to a method for operating the same, to an oscillating device comprising a common mode rejection circuit and to a method for operating the same.

BACKGROUND

A common mode rejection circuit serves the purpose to reject a common mode and a resulting common mode current through an electrical circuit, for example, through an electrical circuit of a radio frequency transceiver of a mobile communication device or through an oscillator. Such a common mode is an interference caused by the oscillator or by the electrical circuit that operates at a frequency. For example, the oscillator that comprises a differential amplifier driven with a high signal swing suffers from large signal effects like the common mode. The common mode appears on the signal outputs of the oscillator as well as on ground and the power supply. This common mode signal or the main oscillation signal may lead to creation of a voltage swing between ground and power supply or even beyond of a DC supply at twice the input frequency oscillator.

Without a common mode rejection or with limited common mode rejection this voltage swing leads to the common mode current through the oscillator. The common mode current may negatively effect signal purity at high oscillation frequencies. Furthermore, with the appearance of common mode signals an additional noise conversion typically up-converts flicker noise to oscillation frequencies. The common mode has a further impact on the current consumption. This is clear if one considers the quality factor (Q factor) of an oscillator or resonator defined by the ratio of the stored energy to the dissipated energy. The common mode currents of the second harmonic frequency do not contribute to the stored energy, but to the dissipated energy. Therefore, the common mode current lowers the quality factor of the oscillator and thus may increase the losses of the oscillator without a common mode rejection circuit or with a limited common mode rejection circuit. Finally this may cause increased power consumption for a certain phase noise performance.

SUMMARY

Embodiments of the invention provide an electrical circuit comprising a circuit element configured to operate at a selected frequency within a variable frequency range, and a common mode rejection circuit element configured to reject a common mode current through the circuit element, wherein the common mode rejection circuit element is adjustable.

A further embodiment provides an electrical circuit comprising a circuit element configured to operate at a selected frequency within a variable frequency range, and means for rejecting a common mode through the circuit element.

Further embodiments provide an oscillation device comprising an oscillator configured to provide a variable oscillation frequency, and a common mode rejection circuit element that is connected to the oscillator in series and comprises a resonant circuit configured to reject a common mode current through the oscillator, wherein a resonance frequency of the resonant circuit is adjustable.

Further embodiments provide a method for operating an electrical circuit comprising a circuit element and a common mode rejection circuit element. The method comprises the step of operating the circuit element at a selected frequency within a variable frequency range, the step of adjusting the common mode rejection circuit element, and the step of rejecting a common mode current through the circuit element by use of a common mode rejection circuit element.

A further embodiment provides a method for operating an oscillation device comprising an oscillator and a common mode rejection circuit element. The method comprises the step of outputting a variable oscillation frequency by use of the oscillator, the step of adjusting a resonance frequency of a resonant circuit of the common mode rejection circuit element, and the step of rejecting a common mode current through the oscillator by use of a common mode rejection circuit element.

BRIEF DESCRIPTION OF THE DRAWINGS

In the following, embodiments of the invention will be described referring to the drawings.

DETAILED DESCRIPTION

Figure 1A:
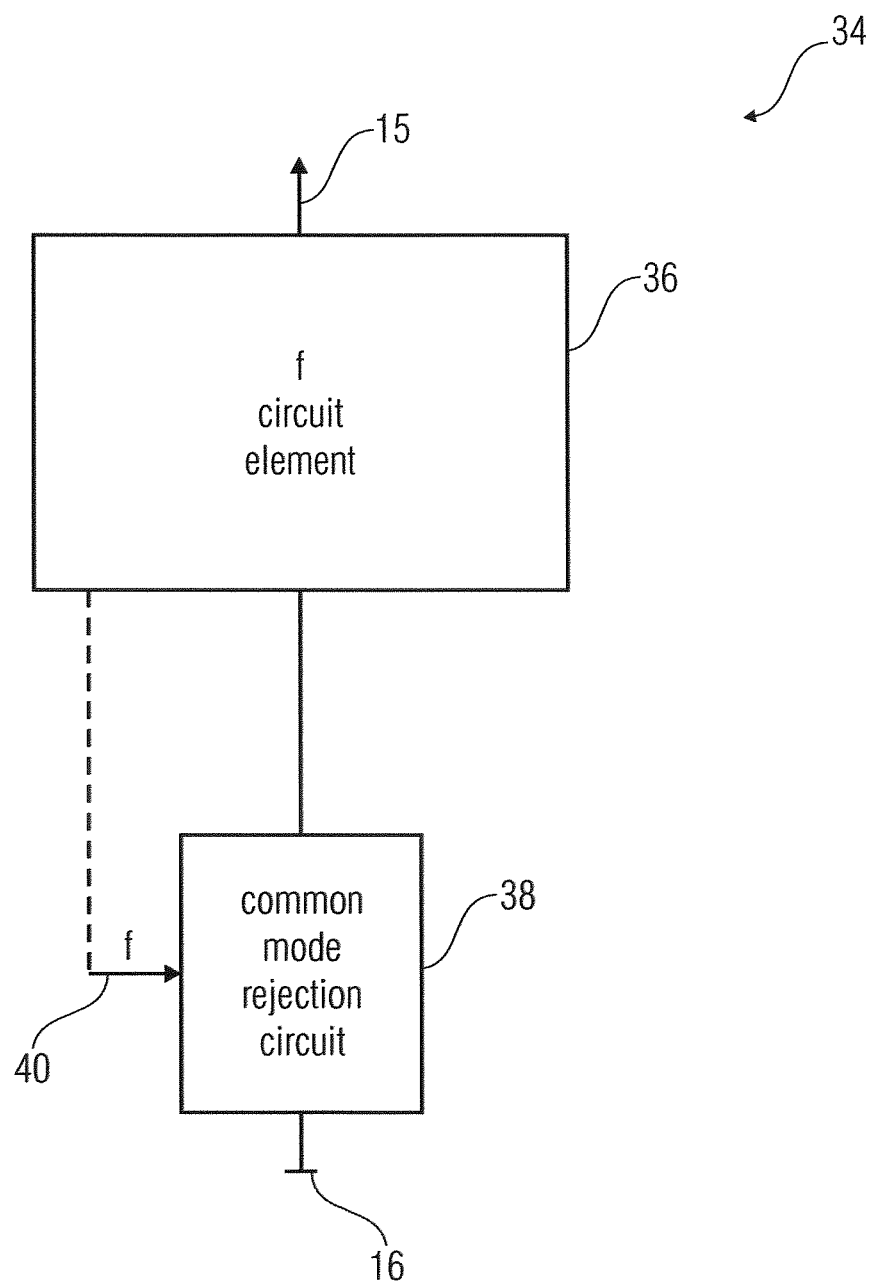
FIG. 1a schematically shows a block diagram of a circuit element and a common mode rejection circuit element according to an embodiment.

Different embodiments of the invention will subsequently be discussed referring to the figures. In advance, identical reference numerals are provided to objects having identical or similar functions so that objects referred to by identical reference numerals within the different embodiments are interchangeable and the description thereof is mutually applicable.

Embodiments of the invention will be discussed below after discussing a common design of a common mode rejection circuit element optimized for high frequencies and low voltage headroom.

Figure 3:
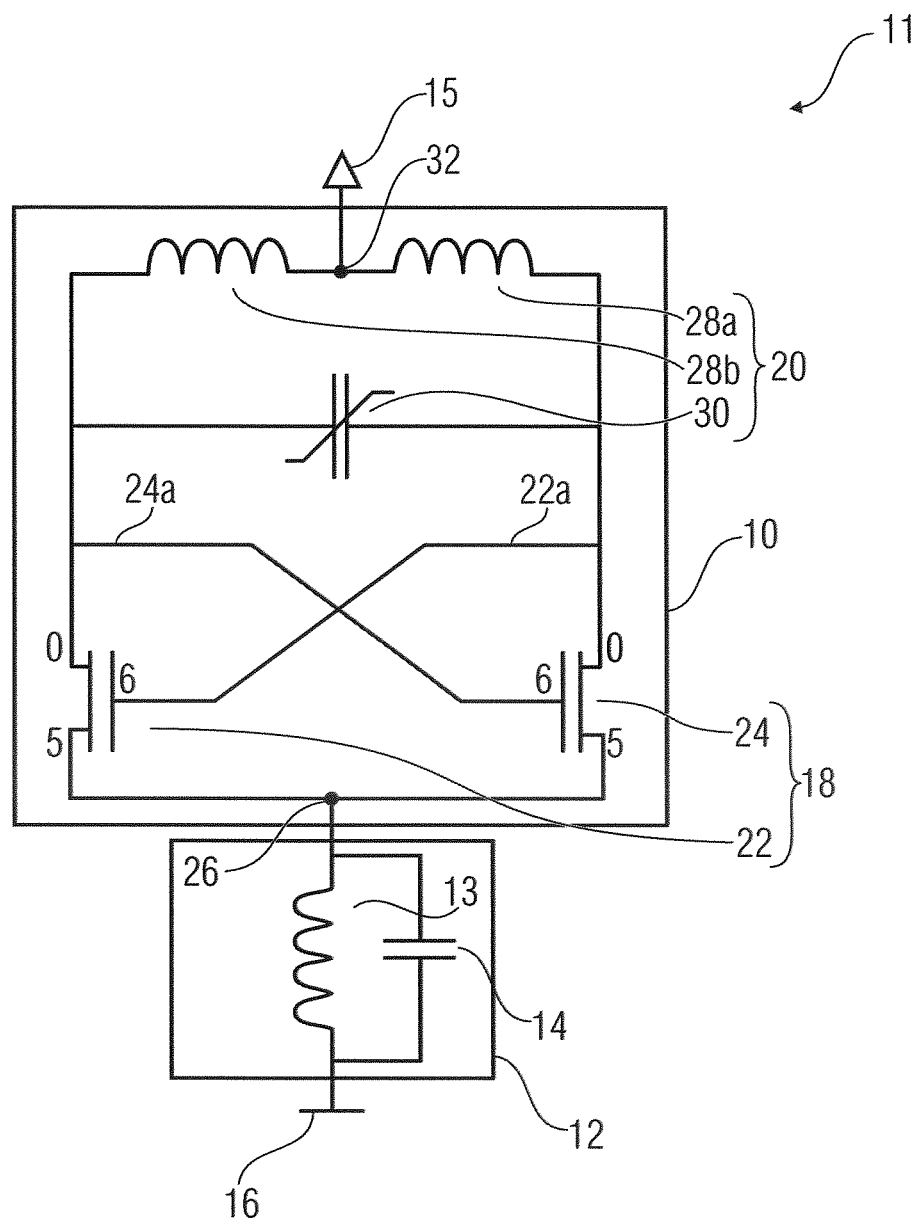
FIG. 3 schematically shows a block diagram of an oscillator and a common mode rejection circuit element in accordance with the state-of-the art.

FIG. 3 shows an oscillation device 11, comprising an oscillator 10 and a common mode rejection circuit element 12. The oscillator 10 and the common mode rejection circuit element 12 are connected in series. Thus, the oscillator is connected to a power supply 15 directly and to ground 16 via the common mode rejection circuit element 12. The common mode rejection circuit element 12 comprises a resonant circuit comprising an inductor 13 and a capacitor 14 that are connected in parallel.

The oscillator 10 comprises a differential amplifier 18 and an LC tank 20. The differential amplifier 18 comprises a differential transistor pair 18 with a first transistor 22 and a second transistor 24, for example NMOS transistors. The two transistors 22 and 24 are coupled via its source contacts to a common source node 26 via which the oscillator 10 is connected to the common mode rejection circuit element 12 and thus to ground 16. Furthermore, the transistor 22 is coupled with the transistor 24 via a first mutual feedback loop 22a that connects a gate contact of the transistor 22 to a drain contact of the transistor 24. Vice versa, a gate contact of the transistor 24 is coupled with a drain contact of the transistor 22 via a second mutual feedback loop 24a. The LC tank 20 comprising two inductors 28a and 28b and an adjustable capacitor 30 forms a resonant circuit. The two inductors 28a and 28b are connected in series, wherein the adjustable capacitor 30 is connected in parallel to the series circuit of the two inductors 28a and 28b. The LC tank 20 is connected between the two drain contacts of the differential transistor pair 18 such that the series circuit of the two inductors 28a and 28b and the adjustable capacitor 30, respectively, connect the two drain contacts. The two inductors 28a and 28b have a common node 32, also referred to as a center tap, via which the oscillator 10 is connected to the power supply 15.

The oscillator 10 is configured to generate an oscillation signal that may be output via two sides of the LC tank 20 if a DC voltage is applied between ground 16 and power supply 15. Here, the LC tank 20 may be stimulated to oscillation by the differential amplifier 18. Within the LC tank 20, charge flows back and forth between the plates of the adjustable capacitor 30 through the inductors 28a and 28b, so that a current is oscillating at a resonance frequency of the LC tank 20. In common oscillators 10 the oscillation signal is a so-called rail-to-rail signal. This means that the maximum voltage results in a high slew rate that leads to low power consumption and to a good phase noise performance. The differential amplifier 18 operates to compensate the losses of the LC tank 20. Here, the respective transistors 22 and 24 are controlled via the respective feedback loop 22a and 24a so that the current flowing through the transistors 22 and 24 oscillates in phase with the resonance frequency of the resonant LC tank 20 depending on a respective state of the transistors 22 and 24. Due to the two feedback loops 22a and 24a the transistor 22 is switched on if charge flows in a first direction (forth) within the LC tank 20 and the transistor 24 is switched on if charge flows in a second direction (back).

The LC tank 20 acts as a resonator that may be controlled in order to determinate the oscillation frequency. By adjusting the (various controllable) capacitance of the adjustable capacitor 30, the resonance frequency of the LC tank 20 and thus the wanted oscillation frequency of the oscillator 10 may be tuned. This enables once to set the oscillator to a wanted frequency band and to put a modulation on the oscillation frequency. A typical (operational) tuning range for mobile communication systems is 1 GHz at a nominal oscillation frequency of 3.6 GHz. This may lead to a tuning range of 2 GHz for the second harmonic frequency at an oscillation frequency of 7.2 GHz. For example, a commode mode current may be caused at a frequency that lies within the tuning range of the second harmonic frequency. This common mode current is rejected by the common mode rejection circuit element 12, wherein the impedance of the element 12 is maximized at the common mode frequency. Background thereof is that a DC series resistance of the inductor 13 reduces a DC voltage drop across the same to a negligible amount. The impedance of the common mode rejection circuit element 12 is high with respect to the low DC voltage drop in case of resonance. Thus, in order to achieve the highest common mode rejection the resonance frequency of the resonant circuit 12 is selected such that the resonance frequency substantially complies with the frequency of the commode mode. The adaption of the resonance frequency to the frequency of the commode mode may be done by selecting the inductance of the inductor 13 or the capacitance of the capacitor 14. Due to the fix inductance of the inductor 13 and the fixed capacitance of the capacitor 14 the common mode rejection circuit element 12 has a fixed resonance frequency and is optimized to a specific oscillation frequency and/or to another performance parameters like a phase noise parameter.

However, the oscillation frequency of the oscillator 10 is variable, as shown above with respect to the tuning range of a GSM or UMTS oscillator. Thus, the common mode rejection circuit element 12 may have a broadband frequency characteristic, e.g. of 3 dB, in order to cover the entire frequency range. However, the quality factor of the LC tank 20 is reduced by increasing the bandwidth. Due to the reduction of the quality factor, the effective parallel resistance of the common mode rejection circuit element 12 is reduced in the resonance case and thus the common mode rejection becomes lower. In general, the optimal operation frequency of a common mode rejection circuit element 12, that may be used for oscillators or systems having a large tuning range, is limited to a small portion of the overall tuning range at specific performance parameters, wherein the common mode rejection at frequencies besides this small portion is not effective. Therefore, there is a need for an improved approach of a common mode rejection circuit element in order to ensure a high common mode rejection for each tunable oscillation frequency.

Below, an improved approach of a common mode rejection circuit element will be discussed. The following embodiments are based on the principle of using a common mode rejection circuit element that is exemplarily adjustable as a function of a selected frequency of a circuit element or as a function of an oscillation frequency of an oscillator, wherein an embodiment of a common mode rejection circuit element that is adjustable as a function of another performance parameter will be discussed with respect to FIG. 1b.

FIG. 1a shows an electrical circuit 34 comprising a circuit element 36 and a common mode rejection circuit element 38. The circuit element 36 and the common mode rejection circuit element 38 are connected in series, wherein the circuit element 36 is directly connected to the power supply 15 and is connected to ground 16 via the common mode rejection circuit element 38. The circuit element 36 may be an oscillator, mixer, buffer, operational amplifier or differential amplifier that is configured to operate at a selected frequency within a variable frequency range.

Analogously to the oscillator 10 according to FIG. 3, a common mode current through the circuit element 36 may be generated due to the operation at the selected frequency. This common mode current is rejected by the common mode rejection circuit element 38. In order to offer optimum adaptation of the common mode rejection to the selected frequency, the common mode rejection circuit element 38 is adjustable as a function of the selected frequency. Therefore, the common mode rejection circuit element 38 may receive information 40 on the selected frequency (f) from the circuit element 36 or may be controlled by an external controller via a control signal. Here, it is advantageous that the controllable or adjustable common mode rejection circuit element 38 may increase the impedance at frequency depending on the selected frequency. So, the bandwidth of the common mode rejection circuit element 38 may be much smaller compared to the common mode rejection circuit element 12 (cf. FIG. 3). Furthermore, the common mode rejection will be higher without reducing the quality factor, also referred to as loaded Q. This leads to an energy consumption improvement and to an improvement in phase noise performance. With less dissipated energy the quality factor increases and thus the overall phase noise is reduced. Thus, the adaptable or tunable common mode rejection may have a positive influence on a flicker noise, white noise, pushing, cross-coupling, temperature range and/or tuning range.

Figure 1B:
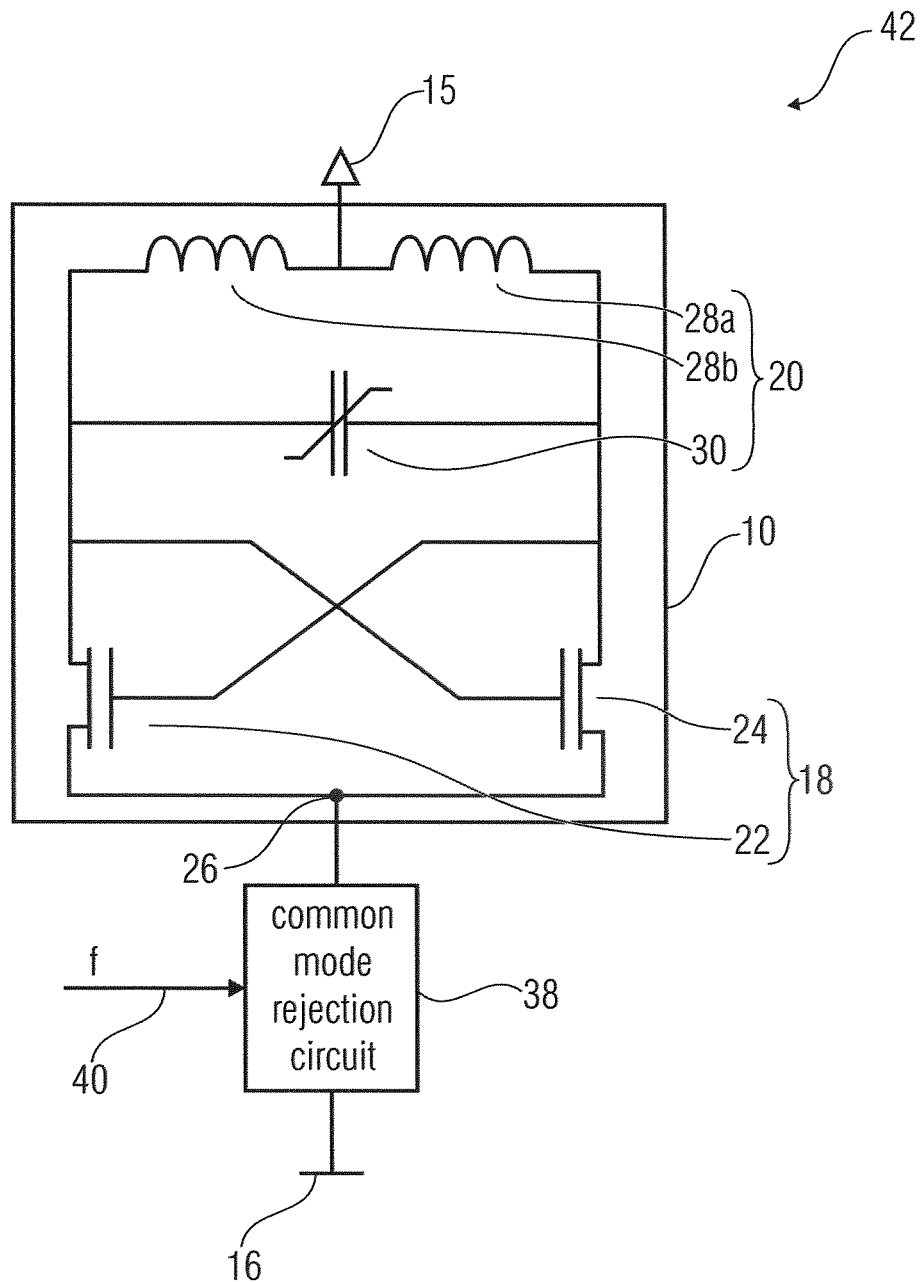
FIG. 1b schematically shows a block diagram of an oscillator and a common mode rejection circuit element according to an embodiment.

FIG. 1b shows an oscillation device 42 that comprises an oscillator similar to that illustrated in FIG. 3 and the common mode rejection circuit element 38 according to FIG. 1a. The common mode rejection circuit element 38 is connected to the oscillator 10 in series via the source common node 26 via which the differential transistor pair 18 of the differential amplifier 18 is coupled. The common mode rejection circuit element 38 is configured to receive information 40 on a variable oscillation frequency (f) of the oscillator 10 that may be tuned by changing the capacitance of the adjustable capacitor 30. The functionality of the common mode rejection circuit element 38 corresponds with the functionality as discussed above. In one embodiment, the oscillator 10 may be used as an oscillator of a mobile communication device.

According to another embodiment the common mode rejection circuit element 38 is adjustable as a function of another performance parameter. Such a performance parameter may be a phase noise parameter, a selected frequency centering parameter or a selected operational mode parameter (e.g. transmitting or receiving communication signals or operational frequency information, selecting a communication band or channel, selecting power input or output case or testing). Thus, the common mode rejection circuit element 38 may be controlled by a controller of the mobile communication device that adapts common mode rejection circuit element 38 in accordance with the respective performance parameter. The adaptation of the adaptive common mode rejection circuit element 38 enables an adaptation of the oscillation device 42 to different conditions or different scenarios. Furthermore, the adaptable common mode rejection circuit element 38 enables a programmable frequency centering common mode rejection so that process variations and offsets due to other effects may be compensated. A further advantage is that a phase noise trade-off between close to carrier noise and far off noise may be changed for different bands and that a trade-off between cross coupling and phase noise performance or between pushing and phase noise performance or between coarse tuning range and phase noise performance may be adapted.

Below, two embodiments of adjustable common mode rejection circuit elements comprising a resonant circuit may be discussed in detail. These common mode rejection circuit elements may be used as a common mode rejection circuit element 38 according to FIGS. 1a and 1b. With respect to the embodiment of FIG. 1c, the common mode rejection circuit element and the resonance frequency of same, respectively, is adapted by adjusting the capacitance of the same. With respect to the embodiment of FIG. 1d, the common mode rejection circuit element is adjusted by adjusting the inductance of the same as a function of the selected frequency. These common mode rejection circuit elements are based on the principles that a common mode rejection current may be rejected when a resonant circuit of the common mode rejection circuit element has high impedance at a frequency of the common mode, as described above.

Figure 1C:
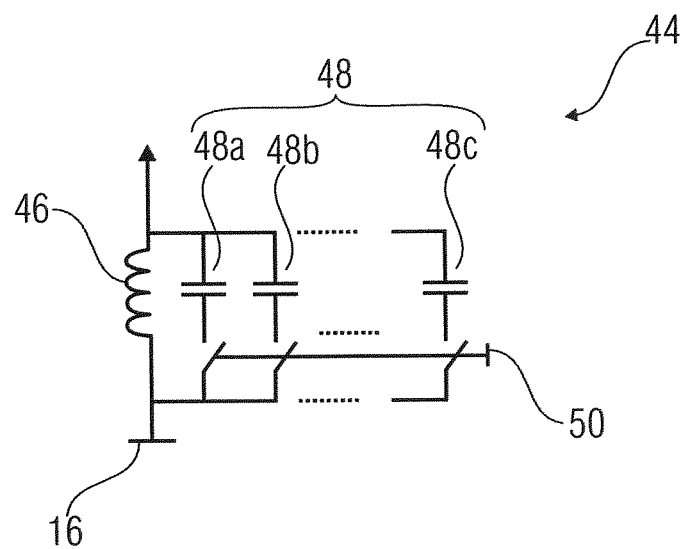
FIG. 1c schematically shows a block diagram of a common mode rejection circuit element having a plurality of switchable capacitors according to an embodiment.

FIG. 1c shows a common mode rejection circuit element 44 that is formed by a resonant circuit. The resonant circuit comprises an inductor 46 and a plurality of switchable capacitors 48 that are connected in parallel to each other. The resonant circuit 44 is connected to ground 16 at a first side and to a power supply at a second side via the oscillator or the circuit element (not shown) that operates at the selected frequency and at the oscillation frequency, respectively. In this embodiment, the plurality of switchable capacitors 48 exemplarily comprises three switchable capacitors 48a, 48b and 48c. In more detail, each switchable capacitor 48a, 48b and 48c comprises a switch via which the respective capacitor 48a, 48b and 48c may be connected to ground 16 with its first capacitor's plate, wherein each capacitor 48a, 48b and 48c is connected to the circuit element of the oscillator with its second capacitor's plate. Each capacitor 48a, 48b and 48c are selectively switchable such that the capacitance of the resonant circuit 44 may be changed in accordance with a switching status. The switching status may be controlled via a control wire 50 or an optional controller as a function of the selected frequency of the circuit element on oscillation frequency of the oscillator.

By changing the capacitance of the resonant circuit 44 the resonance frequency and the impedance of the same may be adjusted for adapting the common mode rejection. For example, by switching the further capacitor, e.g. the capacitor 48c, of the plurality of capacitors 48 in addition to the enabled capacitors, e.g. the capacitors 48a and 48b, the capacitance of the resonant circuit 44 is increased, so the resonance frequency is reduced. According to an embodiment, the capacitance may be adapted such that the resonance frequency is equal to the second harmonic frequency with respect to the selected frequency or the oscillation frequency to maximize the common mode rejection.

Figure 1D:
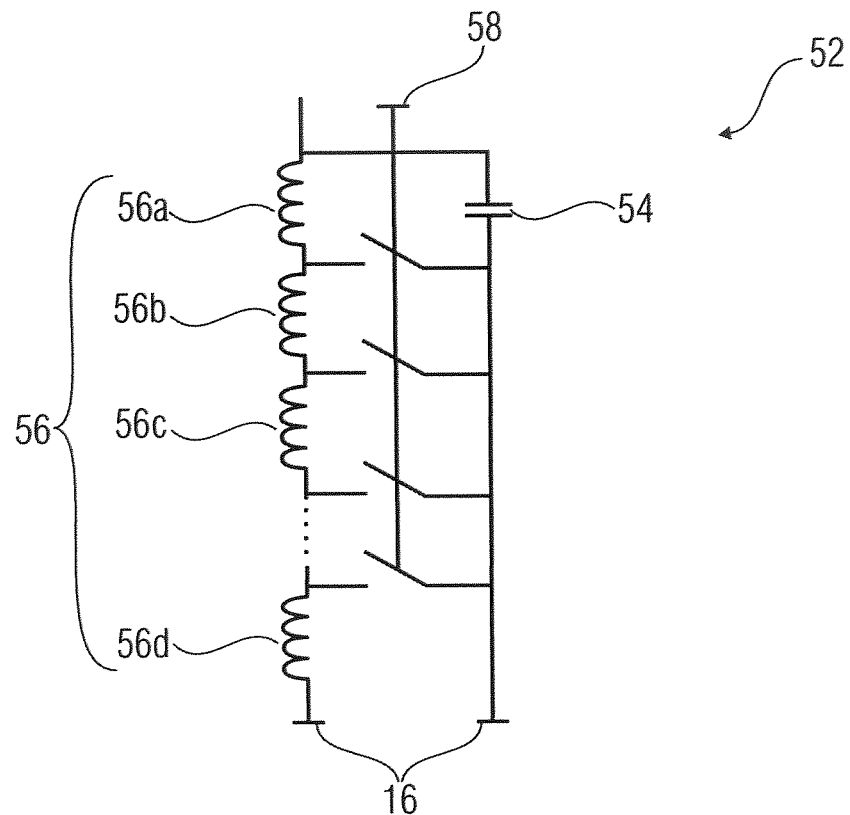
FIG. 1d schematically shows a block diagram of a common mode rejection circuit element having a plurality of switchable inductors according to an embodiment.

FIG. 1d shows a common mode rejection circuit element 52 that comprises a capacitor 54 and a plurality of switchable inductors 56. The plurality of switchable inductors 56 are connected in series, wherein the capacitor 54 is connected in parallel with the series circuit of the plurality of switchable inductors 56. The capacitor 54 and the plurality of inductors 56 are connected to ground 16 at a first side via a ground connection and to the circuit element or to the oscillator (not shown) at a second side via a common node such that a resonant circuit 52 is formed. The plurality of inductors 56 comprises exemplarily four inductors 56a, 56b, 56c and 56d. The first inductor 56a is connected to the common node, while the last inductor 56d is connected to ground 16. Furthermore, each of the three inductors 56a, 56b and 56c is selectively connectable to ground 16 via its switch. In other words, each switch of the three switchable inductors 56a, 56b and 56c connects a respective center tab between two of the inductors 56a, 56b, 56c and 56d to the ground connection of the capacitor 54.

The switches are controllable via a control line 58 by using a control signal or an optional controller as a function of the variable oscillation frequency of the oscillator or as a function of the selected frequency within a variable frequency range of the circuit element (cf. FIG. 1a and 1b) or other performance parameter. By switching the inductors 56a, 56b and 56c, the inductance of the resonant circuit 52 and thus the resonance frequency as well as the impedance may be adjusted in order to adjust the common mode rejection circuit element 52. For example, by switching an inductor of the plurality of inductors 56, e.g. the inductor 56c, to ground the inductance of the resonant circuit 52 is reduced, so the resonance frequency is increased.

Figure 2:
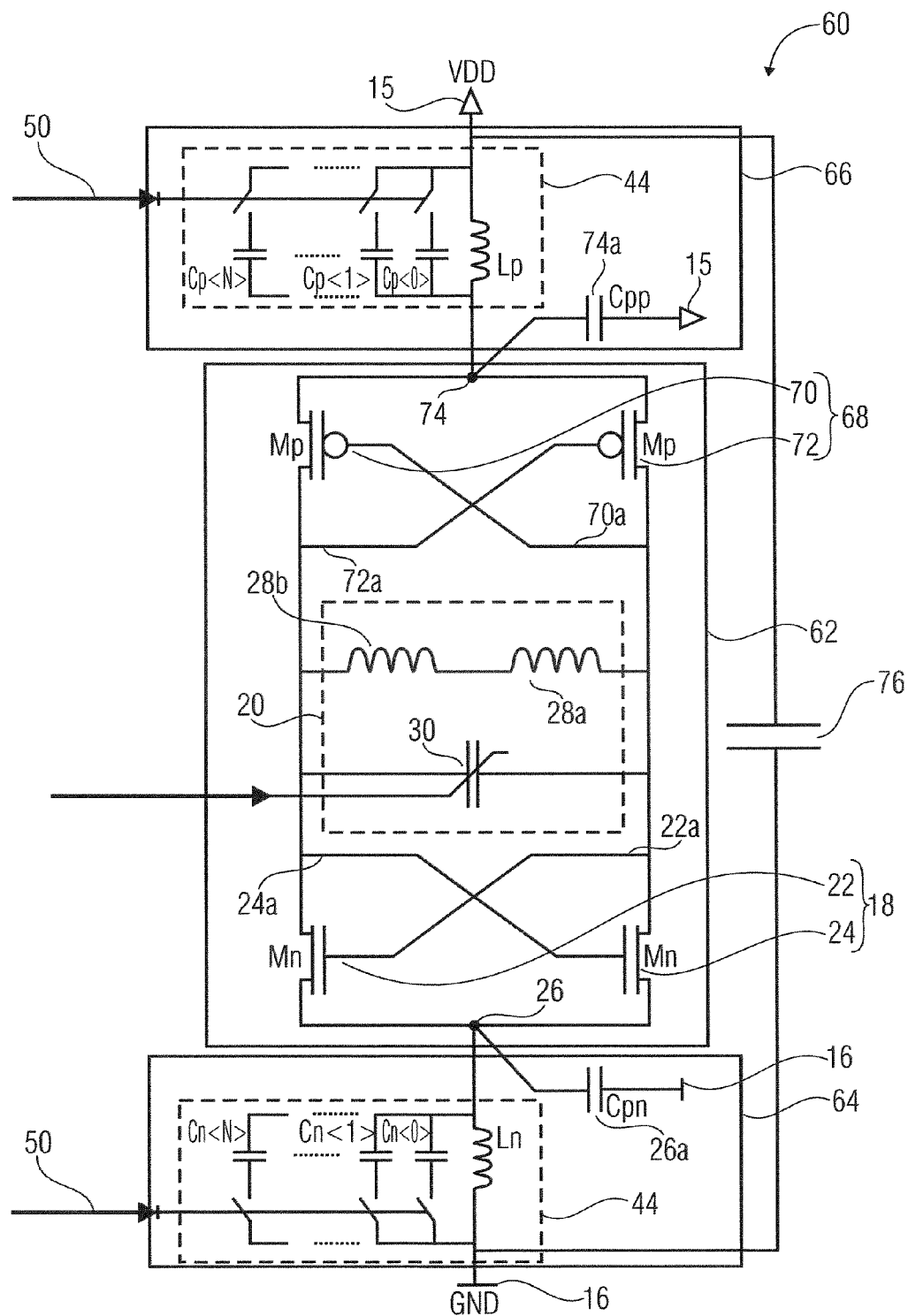
FIG. 2 schematically shows a block diagram of an oscillation device comprising an oscillator and two common mode rejection circuit elements according to an embodiment.

FIG. 2 shows an oscillation device 60 comprising an oscillator 62 and two common mode rejection circuit elements 64 and 66. In this embodiment, the oscillator 62 is connected to ground 16 via the common mode rejection circuit element 64 and to the power supply 15 via the common mode rejection circuit element 66. The common mode rejection circuit elements 64 and 66 correspond in one embodiment with the common mode rejection circuit element 44 shown in FIG. 1c. The oscillator 62 comprises an LC tank 20 corresponding with the LC tank 20 shown in FIG. 1b as well as two differential transistor pairs 18 and 68, also referred to as GM stage, that are coupled as push-pull stages. A push-pull stage of an amplifier means that two transistors of a different type are coupled to each other. Therefore, a type of the transistors of the first differential transistor pair 18, e.g. NMOS or n-type transistors, differs from a type of a second differential transistor pair 68, e.g. PMOS or p-type transistors. The first differential transistor pair 18 corresponds with the transistor pair 18 according to FIG. 1b, wherein each transistor 22 and 24 comprises a common feedback loop 22a and 24a, respectively. The structure of the second differential transistor pair 38 corresponds with the structure of the first differential transistor pair 18. The second differential transistor pair 68 comprises two transistors 70 and 72, wherein each transistor 70 and 72 comprises a common mutual feedback loop 70a and 72a, respectively. Each mutual feedback loop 70a and 72a couples the respective gate contact of the respective transistor 70 or 72 to the drain contact of the other transistor 72 or 70. The two differential transistor pairs 18 and 68 are coupled to each other via the respective drain contacts of the respective transistors 72, 24, 22 and 70. This means that the two transistors 22 and 70 are coupled with its drain contacts via a first common drain connection, while the transistors 24 and 72 are coupled with its drain contacts via a second common drain connection. The LC tank 20 is connected between these two drain connections. In this embodiment, the first common mode rejection circuit element 64 is connected to the oscillator 62 via the common source node 26 of the two transistors 22 and 24 and thus to the source contacts of the transistors 22 and 24. The second common mode rejection circuit element 66 is connected to the oscillator 62 via the second differential transistor pair 68 or, in more detail, via a common source node 74 of the two transistors 70 and 72, wherein the source contacts of the two transistors 70 and 72 are coupled via this common node 74. Thus, in contrast to the embodiment of FIG. 1b, the oscillator 62 is not connected to the power supply 15 via the center tap of the two inductors 28a and 28b, but via the second differential transistor pair 68.

Below, the functionality of the oscillation device 60 will be described. The substantial functionality of the oscillator 62 corresponds with the oscillator 10 in accordance with FIG. 1b, wherein the two differential transistor pairs 18 and 68 coupled as push-pull stages have the purpose to compensate for the oscillator losses. The functionality of the common mode rejection circuit elements 64 and 66 corresponds with the common mode rejection circuit element 44 in accordance with FIGS. 1b and 1c. Below, the background as well as the advantages of the second common mode rejection circuit 66 will be discussed.

Each differential amplifier pair 18 and 68 may comprise a parasitic capacitance 26a and 74a. The first parasitic capacitance 26a is connected between the common source node 26 and ground 16 in parallel with the common mode rejection circuit element 64, while the second parasitic capacitance 74a is connected between the common source node 74 and the power supply 15 in parallel with the second common mode rejection circuit element 66. Due to the fact that the two differential transistor pairs 18 and 68 are not the same, the parasitic capacitances 26a and 74a are usually different. These parasitic capacitances 26a and 74a influence the common mode rejection of the respective differential transistor pair 18 and 68. To compensate for these influences, each of the two common mode rejection circuit elements 64 and 66 is configured in consideration for the respective parasitic capacitance 26a and 74a. For example, the two common mode rejection circuit elements 64 and 66 may be configured to build up a parallel resonance at the second harmonic frequency with respect to the fundamental oscillation frequency. As described above, the capacitances of the two common mode rejection circuit elements 64 and 66 are adaptable as a function of the variable oscillation frequency in order to adapt the resonance frequency of the respective common mode rejection circuit elements 64 and 66. The resonance frequencies of the two common mode rejection circuit elements 64 and 66 are chosen such that the impedance to ground 16 as well as the impedance to the power supply 15 has a maximum at a frequency of the respective common mode current through the respective differential transistor pair 18 and 68. This enables one to reduce the common mode current through the oscillator 62 and to reduce noise effects such as flicker noise or close-in-phase noise. As described above, this leads to a reduction of the energy dissipation of the oscillating device 60.

According to a further embodiment the oscillation device 60 may comprise a blocking capacitor 76 that is connected between the power supply 15 and ground 16. This blocking capacitor 76 is configured to block high frequencies between the power supply 15 and ground 16. The blocking capacitor 76 shunts on the one side the harmonics created by an oscillator 62 and prevents on the other side the oscillator 62 from suffering under high frequency distortion caused by external blocks. The capacitance of the block capacitor 76 is sized such that its impedance is small at the resonance frequencies of the common mode rejection circuit elements 64 and 66. This is advantageous because it enables to choose an inductance and capacitance of the respective common mode rejection circuit elements 64 and 66, regardless of the capacitance of the blocking capacitance 76.

Referring to FIG. 1b, it should be noted that the oscillator 10 may be of a different type, for example, a Meissner oscillator.

Although some aspects have been described in the context of a common mode rejection circuit element for rejecting a common mode through an oscillator, it is clear that these aspects also will present a description of a common mode rejection circuit element for rejecting a common mode through a circuit element, e.g. a mixer, a buffer, an operational amplifier or another circuit which comprises an amplifier or differential amplifier and/or operates at a selected frequency within a variable frequency range.

Referring to the embodiments of FIG. 1c, it should be noted that the plurality of switchable capacitors 48 is illustrated by the three capacitors 48a, 48b and 48c, wherein the plurality of switchable capacitors 48 may also comprise more or less than the three switchable capacitors. Alternatively, the resonant circuit 44 may comprise a continuously adjustable capacitor instead of the plurality of switchable capacitors 48 in order to adjust the capacitance of the resonant circuit 44.

Referring to the embodiments of FIG. 1d, it should be noted that the plurality of inductors 56 may comprise more or less than the four inductors 56a, 56b, 56c and 56d. Furthermore, the resonant circuit 52 of the common mode rejection circuit element may, alternatively, comprise a continuously variable inductor instead of the plurality of switchable inductors 56 in order to adjust the inductance.

Referring to the embodiments of FIGS. 1c and 1d, it should be noted that the common mode rejection circuit element may comprise a plurality of switchable capacitors and a plurality of switchable inductors.

According to another embodiment, the common mode rejection circuit element may be configured to be controlled by an internal or external controller by the use of a control signal. The controller is configured to receive information on the selected frequency or the oscillation frequency or other performance parameter and to adapt the resonance frequency by adjusting the capacitance or inductance of the common mode rejection circuit element.

Although some aspects have been described in context of an apparatus, it is clear that these aspects will represent a description of a corresponding method for operating an electrical circuit comprising a circuit element and a common mode rejection circuit element or for operating an oscillation device comprising an oscillator and a common mode rejection circuit element, where a block or a device corresponds to a method step or a future of a method step. Analogously, aspects described in context with a method step also will represent a description of a corresponding block, item or future of a corresponding apparatus.

The above described embodiments are merely illustrative for the principals of the present invention. It is understood that modifications and variations of the arrangement and the details described herein will be apparent to others skilled in the art. It is the intent, therefore, to be limited only by the scope of the impending patent claims and not by the specific details presented by a way of description and explanation of the embodiments herein.

The invention claimed is:

1. An electrical circuit comprising:
   a circuit element configured to operate at a selected frequency within a variable frequency range that generates a common mode current for the selected frequency; and
   a common mode rejection circuit element configured to reject the common mode current through the circuit element and the common mode rejection circuit element comprising: a plurality of switchable inductors connected in series with one another, the plurality of switchable inductors collectively connected in parallel with a capacitor, wherein the plurality of switchable inductors are configured to have an inductance value as a function of the selected frequency of the circuit element and an operational mode parameter, wherein the operational mode parameter is a selected power input.

2. The electrical circuit according to claim 1, wherein the common mode rejection circuit element is adjustable as a function of the selected frequency or another performance parameter of the circuit element.

3. The electrical circuit according to claim 1, wherein the common mode rejection circuit element comprises a resonant circuit, a resonance frequency of which is adjustable in order to adjust the common mode rejection circuit element.

4. The electrical circuit according to claim 3, wherein the resonant circuit is configured to adapt the resonance frequency such that the resonance frequency is equal to a second harmonic frequency with respect to the selected frequency.

5. The electrical circuit according to claim 2, wherein the common mode rejection circuit element comprises a controller configured to receive an information on the selected frequency and to adjust the common mode rejection circuit element in response thereto.

6. The electrical circuit according to claim 1, wherein the common mode rejection circuit element is connected in series between the circuit element and ground.

7. The electrical circuit according to claim 1, wherein the circuit element comprises an oscillator, mixer, buffer, operational amplifier or differential amplifier.

8. The oscillation device according to claim 1, wherein the common mode rejection circuit element comprises a plurality of switchable capacitors connected in parallel to each other.

9. An oscillation device comprising:
   an oscillator configured to provide a variable oscillation frequency; and
   a common mode rejection circuit element connected to the oscillator in series and comprising a resonant circuit configured to reject a common mode current through the oscillator, wherein a resonance frequency of the resonant circuit is adjustable, the common mode rejection circuit element including a plurality of switchable inductors configured to have an inductance value as a function of the variable oscillation frequency and an operational mode parameter, wherein the operational mode parameter is a selected power input,
   wherein the oscillator comprises a differential amplifier, one or more inductors and an adjustable capacitor for selecting the oscillation frequency, wherein the adjustable capacitor is connected in parallel with the one or more inductors,
   wherein the differential amplifier comprises two differential transistor pairs which are coupled as push-pull stages,
   wherein a type of the transistors of a first differential transistor pair differs from a type of the transistors of a second differential transistor pair,
   wherein each transistor of the two differential transistor pairs is coupled with the other transistor of the respective differential transistor pair via a mutual feedback loop, and
   wherein the adjustable capacitor and the one or more inductors are connected between a common drain contact of a first push-pull stage and a common drain contact of a second push-pull stage.

10. The oscillation device according to claim 9, wherein a resonance frequency of the resonant circuit is adjustable as a function of the oscillation frequency or another performance parameter of the oscillator.

11. The oscillation device according to claim 9 wherein the common mode rejection circuit element is connected in series between the differential amplifier and ground.

12. The oscillation device according to claim 9, wherein the differential amplifier comprises a differential transistor pair coupled to a common source node via which the oscillator is connected to the common mode rejection circuit element,
    wherein each transistor of the differential transistor pair is coupled with the other transistor via a mutual feedback loop, and
    wherein the adjustable capacitor and the one or more inductors are connected between two drain contacts of the differential transistor pair.

13. A method for operating an electrical circuit comprising a circuit element and a common mode rejection circuit element, the method comprising the following steps:
    operating the circuit element at a selected frequency within a variable frequency range;
    adjusting the common mode rejection circuit element based on the circuit element, wherein adjusting the common mode rejection circuit element comprises selectively switching one or more of a plurality of series-connected inductors of the common mode rejection circuit element to have an inductance value as a function of the selected frequency and an operational mode parameter, wherein the operational mode parameter is a selected power input; and
    rejecting a common mode current through the circuit element by use of the common mode rejection circuit element.

14. The method according to claim 13, wherein the step of adjusting the common mode rejection circuit element is performed such that the common mode rejection circuit element is adjusted as a function of the selected frequency or another performance parameter of the circuit element.

15. The method according to claim 14 further comprises a step of receiving an information on the selected frequency from the circuit element and using the information in adjusting the common mode rejection circuit element.

16. An electrical circuit comprising:
- a circuit element configured to operate at a selected frequency within a variable frequency range; and
- a common mode rejection circuit element configured to reject a common mode current through the circuit element, wherein the common mode rejection circuit element is adjustable and comprises a plurality of switchable capacitors connected in parallel to each other and to a switchable inductor for adjusting the resonance frequency, wherein an inductance value of the switchable inductor is adjustable as a function of the selected frequency and an operational mode parameter, wherein the operational mode parameter is a selected power input.

\* \* \* \* \*